(12) United States Patent
Letavic et al.

(10) Patent No.: US 6,313,489 B1
(45) Date of Patent: Nov. 6, 2001

(54) LATERAL THIN-FILM SILICON-ON-INSULATOR (SOI) DEVICE HAVING A LATERAL DRIFT REGION WITH A RETROGRADE DOPING PROFILE, AND METHOD OF MAKING SUCH A DEVICE

(75) Inventors: Theodore Letavic, Putnam Valley; Mark Simpson, Ossining; Richard Egloff, Yorktown Heights, all of NY (US); Andrew Mark Warwick, Stockport (GB)

(73) Assignee: Philips Electronics North America Corporation, New York, NY (US)

( * ) Notice: Subject to any disclaimer, the term of this patent is extended or adjusted under 35 U.S.C. 154(b) by 0 days.

(21) Appl. No.: 09/440,767

(22) Filed: Nov. 16, 1999

(51) Int. Cl.$^7$ .............................. H01L 33/00; H01L 29/78
(52) U.S. Cl. ..................... 257/287; 257/285; 257/256; 257/272
(58) Field of Search ................................... 257/287, 255, 257/259, 272

(56) References Cited

U.S. PATENT DOCUMENTS

| | | | |
|---|---|---|---|
| 5,246,870 | 9/1993 | Merchant | 437/21 |
| 5,300,448 | 4/1994 | Merchant et al. | 437/41 |
| 5,378,920 | 1/1995 | Nakagawa et al. | 257/487 |
| 5,401,982 | 3/1995 | King et al. | 257/59 |
| 5,412,241 | 5/1995 | Merchant | 257/409 |
| 5,420,457 | * 5/1995 | Shibib . | |
| 5,426,325 | 6/1995 | Chang et al. | 257/408 |
| 5,744,851 | 4/1998 | Beasom | 257/487 |
| 5,767,547 | 6/1998 | Merchant et al. | 257/347 |
| 5,849,627 | 12/1998 | Linn et al. | 438/455 |
| 5,973,341 | * 10/1999 | Letavic et al. . | |
| 6,140,170 | * 10/2000 | Shibib . | |

FOREIGN PATENT DOCUMENTS

| | | |
|---|---|---|
| 08064686 | 3/1996 | (JP) . |
| 08181321 | 7/1996 | (JP) . |
| 08181321A | 7/1996 | (JP) . |

OTHER PUBLICATIONS

"SOI Device Structures Implementing 650 V High Voltage Output Devices on VLSIs", by N. Yasuhara et al., Proceedings of the International Electron Devices Meeting.

* cited by examiner

Primary Examiner—Stephen D. Meier
(74) Attorney, Agent, or Firm—Steven R. Biren

(57) ABSTRACT

A lateral thin-film Silicon-On-Insulator (SOI) device includes a semiconductor substrate, a buried insulating layer on the substrate and a lateral transistor device in an SOI layer on the buried insulating layer and having a source region of a first conductivity type formed in a body region of a second conductivity type opposite to that of the first. A lateral drift region of a first conductivity type is provided adjacent the body region and forms a lightly-doped drain region, and a drain contact region of the first conductivity type is provided laterally spaced apart from the body region by the drift region. A gate electrode is provided over a part of the body region in which a channel region is formed during operation and extending over a part of the lateral drift region adjacent the body region, with the gate electrode being at least substantially insulated from the body region and drift region by a surface insulation region. In order to increase breakdown voltage and/or reduce "on" resistance, the lateral drift region is provided with at least a portion with a retrograde doping profile. This may advantageously be done by doping the semiconductor substrate, oxidizing the substrate to form the buried insulating layer, forming the SOI layer on the buried insulating layer, and thermally diffusing dopant from the buried insulating layer into the SOI layer.

4 Claims, 1 Drawing Sheet

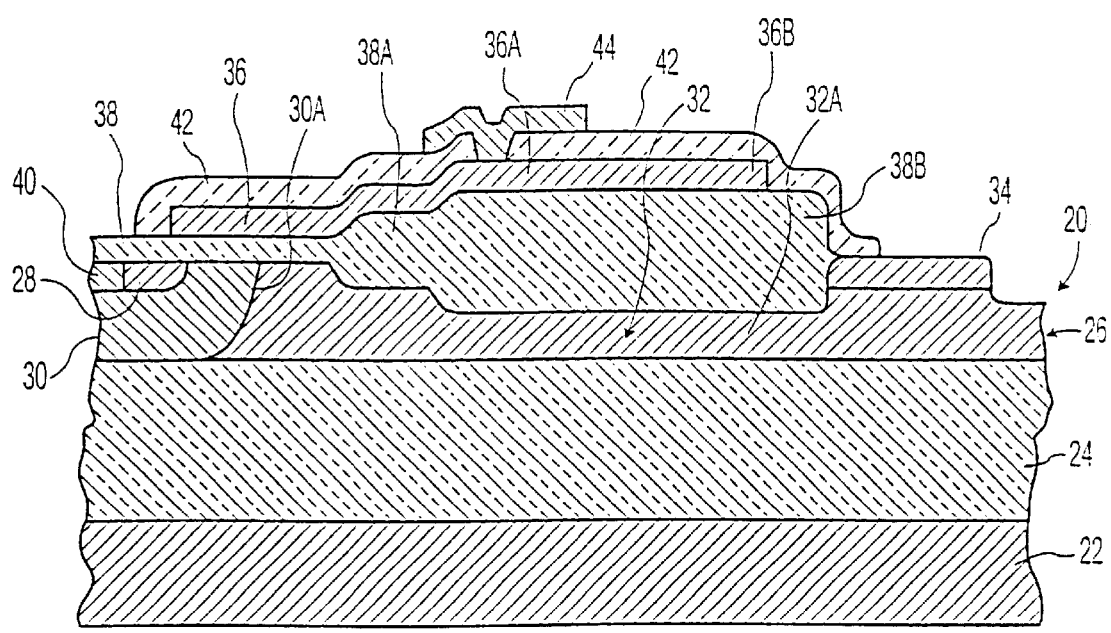

LATERAL THIN-FILM SILICON-ON-INSULATOR (SOI) DEVICE HAVING A LATERAL DRIFT REGION WITH A RETROGRADE DOPING PROFILE, AND METHOD OF MAKING SUCH A DEVICE

BACKGROUND OF THE INVENTION

The invention is in the field of Semiconductor-On-Insulator (SOI) devices, and relates more particularly to lateral SOI devices suitable for high-voltage applications and a method of making such devices.

In fabricating high-voltage power devices, tradeoffs and compromises must typically be made in areas such as breakdown voltage, size, "on" resistance and manufacturing simplicity and reliability. Frequently, improving one parameter, such as breakdown voltage, will result in the degradation of another parameter, such as "on" resistance. Ideally, such devices would feature superior characteristics in all areas, with a minimum of operational and fabrication drawbacks.

One particularly advantageous form of lateral thin-film SOI device includes a semiconductor substrate, a buried insulating layer on the substrate, and a lateral transistor device in an SOI layer on the buried insulating layer, the device, such as a MOSFET, including a semiconductor surface layer on the buried insulating layer and having a source region of a first conductivity type formed in a body region of a second conductivity type opposite to that of the first, an insulated gate electrode over a channel region of the body region and insulated therefrom by a surface insulation region, a lightly-doped lateral region such as a lateral drift region of the first conductivity type, and a drain region of the first conductivity type laterally spaced apart from the channel region by the drift region.

A device of this type is shown in FIG. 1 common to related U.S. Pat. No. 5,246,870 (directed to a method) and U.S. Pat. No. 5,412,241 (directed to a device), commonly-assigned with the instant application and incorporated herein by reference. The device shown in FIG. 1 of the aforementioned patents is a lateral SOI MOSFET device having various features, such as a thinned SOI layer with a linear lateral doping region and an overlying field plate, to enhance operation. As is conventional, this device is an n-channel or NMOS transistor, with n-type source and drain regions, manufactured using a process conventionally referred to as NMOS technology. A more basic device is shown in U.S. Pat. No. 5,300,448, also commonly-assigned with the instant application and incorporated herein by reference.

More advanced techniques for enhancing high-voltage and high-current performance parameters of SOI power devices are shown in U.S. patent application Ser. No. 08/998,048, commonly-assigned with the instant application and incorporated herein by reference.

Thus, it will be apparent that numerous techniques and approaches have been used in order to enhance the performance of power semiconductor devices, in an ongoing effort to attain a more nearly optimum combination of such parameters as breakdown voltage, size, current-carrying capability and manufacturing ease. While all of the foregoing structures provide varying levels of improvement in device performance, no one device or structure fully optimizes all of the design requirements for high-voltage, high-current operation.

Accordingly, it would be desirable to have a transistor device structure capable of high performance in a high-voltage, high-current environment, in which operating parameters, and in particular breakdown voltage, and/or "on" resistance, are further optimized.

SUMMARY OF THE INVENTION

It is therefore an object of the present invention to provide a transistor device structure capable of high performance in a high-voltage, high-current environment. It is a further object of the invention to provide such a transistor device structure in which operating parameters such as breakdown voltage and/or "on" resistance are enhanced.

In accordance with the invention, these objects are achieved in a lateral thin-film SOI device structure of the type described above in which a lightly-doped lateral region (typically the drift region) is provided with a retrograde doping profile such that the doping profile at a portion of the lateral region adjacent the buried insulating layer is greater than the doping at a portion of the lateral region adjacent the surface insulation region.

In a preferred embodiment of the invention, an arsenic doping is used to obtain the retrograde doping profile, and the doping at the portion of the lateral drift region adjacent the buried insulating layer is about 50% greater than the doping at the portion of the lateral drift region adjacent the surface insulation region.

In a further preferred embodiment of the invention, devices in accordance with the invention are made by a method in which the semiconductor substrate is doped with a desired dopant, the semiconductor substrate is oxidized to form the buried insulating layer containing the dopant, an SOI layer is formed on the buried insulating layer containing the dopant, and the dopant is thermally diffused from the buried insulating layer into the SOI layer to form the retrograde doping profile.

Lateral thin-film SOI devices in accordance with the present invention offer a significant improvement in that a combination of favorable performance characteristics making the devices suitable for operation in a high-voltage, high-current environment, and in particular high breakdown voltage and/or reduced "on" resistance, can be achieved.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which the single FIGURE shows a simplified cross-sectional view of a lateral thin-film SOI device in accordance with a preferred embodiment of the invention.

In the drawing, semiconductor regions having the same conductivity type are generally shown hatched in the same direction in the cross-sectional views, and it should be understood that the figures are not drawn to scale.

DESCRIPTION OF THE PREFERRED EMBODIMENTS

In the simplified cross-sectional view of the FIGURE, a lateral thin-film device, here an SOI MOS transistor 20, includes a semiconductor substrate 22, a buried insulating layer 24, and a semiconductor surface SOI layer 26 in which the device is fabricated. The MOS transistor includes a source region 28 of one conductivity type, a body region 30 of a second, opposite conductivity type, a lateral drift region 32 of the first conductivity type which forms a lightly-doped drain region and a drain contact region 34, also of the first conductivity type. The basic simplified device structure is completed by a gate electrode 36, which is insulated from the underlying semiconductor surface layer 26 by an oxide surface insulation region 38. Within the scope of the invention, the MOS transistor which serves as the starting point for the present invention may have various performance-enhancing features, such as a linear lateral doping profile, a stepped oxide region 38A, 38B, an extended gate electrode structure forming a field plate portion 36A, 36B, and a thinned lateral drift region portion 32A, all as detailed in the aforementioned prior art, or other performance-enhancing features as desired, without departing from the spirit or scope of the invention. Additionally, the MOS transistor 20 may also include a surface contact region 40, in contact with source region 28, located in the body region 30 and of the same conductivity type as the body region but more highly doped. The structure is completed by a dielectric layer 42, over which is provided a metal contact layer 44, here shown as contacting the gate electrode 36 (typically made of polysilicon) through an aperture in the dielectric layer 42.

It will be understood that the simplified, representative device shown in the FIGURE depicts a particular device structure, but that wide variations in both device geometry and configuration can be used within the scope of the invention. Additionally, the present invention may be incorporated into various different types of high-voltage thin-layer SOI devices having different underlying structures well-known to those skilled in this art.

Although the structure as so far described above has generally good operating characteristics, it is still limited in terms of the maximum achievable combination of breakdown voltage rating and "on" resistance. The performance tradeoff inherent in prior-art devices stems from the inherent conflict between the higher doping level in the drift region, and in particular the portion of the drift region which forms the lightly-doped drain region, required for low "on" resistance, and the lower doping level in this region required for optimizing breakdown voltage. As noted above, various expedients, such as changing the thickness of this region or employing a laterally-graded linear doping profile (in the horizontal direction), can improve the "on" resistance/breakdown figure of merit, but further improvement would be desirable.

In the instant invention, this improvement is achieved by taking a different approach. Whereas the prior-art devices of this general type have a constant doping profile throughout the thickness of the SOI layer (i.e. in the vertical direction), the present invention alters the doping level in the vertical direction within at least a portion of the SOI layer, and also provides a unique and commercially advantageous method for doing so. More particularly, an improved device is fabricated by providing a retrograde doping profile in which the doping at the portion of the lateral drift region adjacent the buried insulating layer is greater than the doping at the portion of the lateral drift region adjacent the surface insulation region over at least a portion of the SOI layer. In other words, the doping in the lateral drift region increases from the top to the bottom of this region.

Such a doping profile is advantageous because whereas the "on" resistance of the device is dependent upon the total integrated charge throughout the thickness of the SOI layer rather than the exact distribution of charge throughout the thickness of this layer, the breakdown voltage is dependent upon the spatial distribution of charge throughout the thickness of the SOI layer in the vertical direction. Specifically, a higher doping or charge level at the upper surface of the SOI layer, in the vicinity of the surface insulation region, degrades the voltage breakdown characteristics of the device due to high electric fields. Accordingly, it has been determined that the "on" resistance/ breakdown-voltage figure of merit can be further optimized by reducing the doping at the upper portion of the lateral drift region, while maintaining a relatively high total integrated charge throughout the thickness of this region by employing a retrograde doping profile. Additionally, incorporating the retrograde doping profile improves the saturating current in devices operated in the source-follower mode of operation, since the relatively heavier doping at the lower surface of the SOI layer results in less depletion of this layer from the substrate, thus increasing saturation current capability.

With reference to the Figure, the retrograde doping profile is provided in the lightly-doped drain region of the lateral drift region 32, such that the doping of this region increases in a direction from the oxide surface insulation region 38 down to the buried insulating layer 24. While it will be recognized that the invention is not limited to particular doping levels, profiles, or dopants, as a representative example the dopant may be arsenic, with the retrograde doping profile in the SOI layer being achieved by providing a concentration ranging from of about $1.2 \times 10^{16}$ cm$^{-3}$ adjacent the buried insulating layer down to a concentration of about $8 \times 10^{15}$ cm$^{-3}$ adjacent the surface insulation region.

Using conventional process technologies, it is difficult if not impossible to form a retrograde doping profile as described above in SOI layers which are typically 1–2 microns thick, such as those used in high-voltage devices. While such a doping profile could theoretically be provided by ion implantation, this would require implant energies on the order of 1 Mev, a level which is not presently commercially feasible, and which in any case would be very difficult to mask.

In accordance with the present invention, a retrograde doping profile is provided in the SOI layer by using the buried insulation layer as a diffusion source to dope the SOI layer from below, thus avoiding the difficulties inherent in achieving such a profile by ion implantation.

This may be accomplished by providing a conventional silicon wafer with the desired dopant, for example by doping the wafer with arsenic, to the solid-solubility limit of arsenic. When the buried insulating layer is formed by growing oxide from the doped silicon wafer, the dopant is incorporated into the buried oxide automatically during the growth of the oxide itself. After formation of the SOI layer over the buried oxide insulating layer, thermal diffusion cycles used to form a high-voltage device in the SOI layer will automatically cause the dopant, such as arsenic, to diffuse out of the buried oxide and into the SOI layer, with thermal diffusion automatically resulting in the desired retrograde doping profile. Note that if a linear doping profile in the horizontal direction is employed, the lateral charge at more highly doped areas of the SOI layer will swamp out the retrograde doping profile, so that a retrograde doping profile will exist over only a portion of the SOI layer. Typically, temperatures used during the thermal diffusion process will be in excess of 1200° C. to achieve the desired retrograde doping profile.

As will be apparent from the foregoing description, the described method has the substantial advantage that the desired retrograde doping profile, which would otherwise be difficult if not impossible to achieve in an SOI layer, is formed in an efficient and economical manner, with several of the process steps that would otherwise be necessary in device fabrication serving double duty by also forming the desired retrograde doping profile.

In the foregoing manner, the present invention provides a transistor device structure capable of high performance in a high-voltage, high-current environment, while enhancing operating parameters and in particular breakdown voltage and "on" resistance. Additionally, the invention provides a simple and economical method of making such a device structure.

While the invention has been particularly shown and described with reference to several preferred embodiments thereof, it will be understood by those skilled in the art that various changes in form and detail may be made without departing from the spirit or scope of the invention. In this application it should be understood that the word "a" or "an" preceding an element does not exclude the presence of a plurality of such elements, and that the word "comprising" does not exclude the presence of other elements or steps than those described or claimed.

What is claimed is:

1. A lateral thin-film Silicon-On-Insulator (SOI) device comprising a semiconductor substrate, a buried insulating layer on said substrate, and a lateral transistor device in an SOI layer on said buried insulating layer and having a source region of a first conductivity type formed in a body region of a second conductivity type opposite to that of the first, a lateral drift region of said first conductivity type adjacent said body region and forming a lightly-doped drain region, a drain contact region of said first conductivity type and laterally spaced apart from said body region by said lateral drift region, and a gate electrode over a part of said body region in which a channel region is formed during operation and extending over a part of said lateral drift region adjacent said body region, said gate electrode being insulated from said body region and drift region by a surface insulation region, and said lateral drift region having at least a portion with a retrograde doping profile such that the doping at a portion of said lateral drift region adjacent said buried insulating layer is greater than the doping at a portion of said lateral drift region adjacent said surface insulation region.

2. A lateral thin-film Silicon-On-Insulator (Sol) device as in claim 1, wherein said retrograde doping profile comprises an arsenic dopant.

3. A lateral thin-film Silicon-On-Insulator (SOI) device as in claim 2, wherein the doping at said portion of said lateral drift region adjacent said buried insulating layer is about 50% greater than the doping at said portion of said lateral drift region adjacent said surface insulation region.

4. A lateral thin-film Silicon-On-Insulator (SOI) device comprising a semiconductor substrate, a buried insulating layer on said substrate, and a lateral device in an SOI layer on said buried insulating layer and having a lightly-doped lateral region and a surface insulation region over said lateral region, said lateral region having at least a portion with a retrograde doping profile such that the doping at a portion of said lateral region adjacent said buried insulating layer is greater than the doping at a portion of said lateral region adjacent said surface insulation region.

* * * * *